(12) United States Patent
Nian et al.

(10) Patent No.: US 7,944,728 B2
(45) Date of Patent: May 17, 2011

(54) PROGRAMMING A MEMORY CELL WITH A DIODE IN SERIES BY APPLYING REVERSE BIAS

(75) Inventors: Yibo Nian, Milpitas, CA (US); Tanmay Kumar, Pleasanton, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 210 days.

(21) Appl. No.: 12/318,021

(22) Filed: Dec. 19, 2008

(65) Prior Publication Data

US 2010/0157652 A1      Jun. 24, 2010

(51) Int. Cl.
*G11C 11/00* (2006.01)
(52) U.S. Cl. ........ 365/148; 365/163; 365/158; 365/171; 365/173
(58) Field of Classification Search .................. 365/148, 365/163, 158, 171, 173, 189.16
See application file for complete search history.

(56) References Cited

U.S. PATENT DOCUMENTS

| | | | |
|---|---|---|---|
| 3,875,566 A | | 4/1975 | Helbers |
| 4,646,266 A | * | 2/1987 | Ovshinsky et al. |
| 5,751,012 A | * | 5/1998 | Wolstenholme et al. |
| 5,835,396 A | * | 11/1998 | Zhang |
| 6,034,882 A | * | 3/2000 | Johnson et al. |
| 6,055,180 A | * | 4/2000 | Gudesen et al. |
| 6,185,122 B1 | * | 2/2001 | Johnson et al. |
| 6,420,215 B1 | * | 7/2002 | Knall et al. |
| 6,618,295 B2 | * | 9/2003 | Scheuerlein |
| 6,927,996 B2 | * | 8/2005 | Eaton et al. .................... 365/171 |
| 6,952,030 B2 | * | 10/2005 | Herner et al. |
| 7,176,064 B2 | * | 2/2007 | Herner |
| 7,499,304 B2 | * | 3/2009 | Scheuerlein et al. .......... 365/148 |
| 7,719,874 B2 | * | 5/2010 | Scheuerlein et al. .......... 365/148 |
| 2005/0226067 A1 | * | 10/2005 | Herner et al. |
| 2005/0269553 A1 | * | 12/2005 | Sen et al. |
| 2006/0002173 A1 | | 1/2006 | Parkinson et al. |
| 2006/0067117 A1 | * | 3/2006 | Petti |
| 2007/0002610 A1 | | 1/2007 | Knall |
| 2007/0072360 A1 | * | 3/2007 | Kumar et al. |
| 2007/0164388 A1 | * | 7/2007 | Kumar et al. |
| 2007/0284656 A1 | * | 12/2007 | Radigan et al. |
| 2008/0007989 A1 | * | 1/2008 | Kumar |

(Continued)

FOREIGN PATENT DOCUMENTS

EP      1 895 540 A1      3/2008

(Continued)

OTHER PUBLICATIONS

International Search Report and Written Opinion mailed Mar. 23, 2010 received in PCT/US2009/067604.

(Continued)

*Primary Examiner* — Vu A Le
*Assistant Examiner* — Han Yang
(74) *Attorney, Agent, or Firm* — The Marbury Law Group, PLLC

(57) ABSTRACT

A method of programming a memory cell comprises applying a reverse bias to the memory cell using a temporary resistor in series with the memory cell. The memory cell comprises a diode and a resistivity switching material element in series. The state of the resistivity switching material element changes from a first initial state to a second state different from the first state.

14 Claims, 7 Drawing Sheets

U.S. PATENT DOCUMENTS

2010/0321978 A1* 12/2010 Inoue .................... 365/148

FOREIGN PATENT DOCUMENTS

| WO | WO 02/091385 A1 | 11/2002 |
| WO | WO 2008/016833 A2 | 2/2008 |
| WO | WO 2008/082995 A1 | 7/2008 |

OTHER PUBLICATIONS

U.S. Appl. No. 11/819,562, filed Jun. 28, 2007, Albert Meeks et al.*
U.S. Appl. No. 09/560,626, filed Apr. 28, 2000, Knall.*
U.S. Appl. No. 09/638,428, filed Aug. 14, 2000, Johnson.*
U.S. Appl. No. 09/897,705, filed Jun. 29, 2001, Kleveland.*
U.S. Appl. No. 10/185,508, filed Jun. 27, 2002, Cleeves.*
U.S. Appl. No. 11/287,452, filed Nov. 23, 2005, Herner.*
U.S. Appl. No. 12/003,571, filed Dec. 28, 2007, Petti.*
U.S. Appl. No. 12/005,277, filed Dec. 27, 2007, Kumar.*
U.S. Appl. No. 12/153,873, filed May 27, 2008, Chen.*
Peter K. Nagi et al., "A 256kb 3.0V 1T1MTJ Nonvolatile Magnetoresistive RAM", Digest of Technical Papers of the 2001 IEEE International Solid-State Circuits Conference, ISSCC 2001/ Session 7/Technology Directions: Advanced Technologies/7.6, Feb. 6, 2001, 3 pgs.

* cited by examiner

PROGRAMMING A MEMORY CELL WITH A DIODE IN SERIES BY APPLYING REVERSE BIAS

BACKGROUND

The present invention relates generally to the field of memory devices and more specifically to the field of nonvolatile memory devices containing diode steering elements.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'. In a one diode, one resistivity switching material memory cell, the state of the memory cell is programmed by forward biasing the diode. However, the current that surges through the diode of a memory cell when the resistivity switching material changes state during forward biasing can be difficult to control.

SUMMARY

One embodiment relates to method of programming a memory cell. A reverse bias is applied to the memory cell using a temporary resistor in series with the memory cell. The memory cell comprises a diode and a resistivity switching material element in series. The state of the resistivity switching material element changes from a first initial state to a second state different from the first state.

Another embodiment relates to a method of programming a memory cell. A first reverse bias is applied to the memory cell using a first temporary resistor in series with the memory cell. The memory cell comprises a diode and a resistivity switching material element in series. The state of the resistivity switching material element changes from a first initial state to a second state different from the first state.

A second reverse bias is then applied to the memory cell using a second temporary resistor in series with the memory cell. The state of the resistivity switching material element changes from the second state to a third state different from the second state. The first temporary resistor and the second temporary resistor have different resistances.

DETAILED DESCRIPTION

A structure for and method of programming a memory cell with a diode in series by applying reverse bias are described. In the following description, for purposes of explanation, numerous specific details are set forth to provide a thorough understanding of exemplary embodiments of the invention. It will be evident, however, to one skilled in the art that the invention may be practiced without these specific details. The drawings are not to scale. In other instances, well-known structures and devices are shown in simplified form to facilitate description of the exemplary embodiments.

Figure 1:
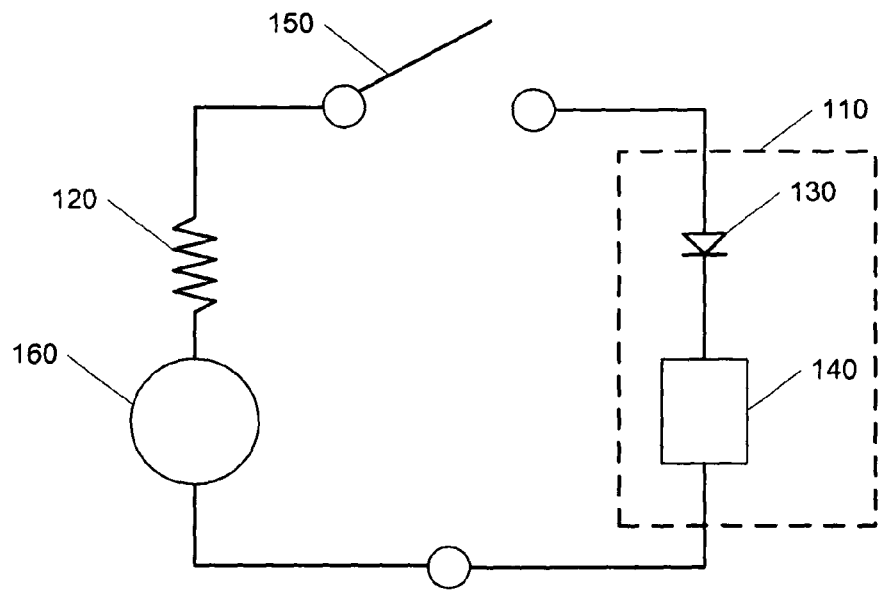
FIG. 1 is a schematic of a memory cell with a temporary resistor in accordance with a representative embodiment.

Referring to FIG. 1, a schematic of a memory cell 110 with a temporary resistor 120 in accordance with a representative embodiment is shown. The memory cell 110 includes a diode 130 and a resistivity switching material element 140. Alternatively, the memory cell 110 can include multiple diodes; for example, a diode can be located on both sides of the resistivity switching material element. In one embodiment, a second diode is also included in the memory cell. The memory cell 110 is part of a memory cell array in a memory device. During programming, the temporary resistor 120 and a voltage source 160 are electrically connected to the memory cell 110 by a switch 150. The memory cell 110 and the voltage source 160 are grounded together.

The diode 130 can be any suitable diode, such as a semiconductor diode. Examples of a semiconductor diode include p-n and p-i-n semiconductor diodes formed in single crystal, polycrystalline or amorphous semiconductor material, such as silicon, germanium, silicon-germanium or compound semiconductors, such as Group III-V or II-VI semiconductors. Alternatively, the first diode steering element 120 can be a metal insulator metal (MIM) diode, a metal insulator-insulator metal (MIIM) diode, tunneling diodes, or any two terminal non-linear conducting device.

The resistivity switching material element 140 is preferably a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

The temporary resistor 120 can be any suitable resistor. For example the resistor can be a standard wire-wound resistor, a surface mounted resistor, or integrated into the same die as the memory cell 110. The temporary resistor 120 can be any value; however, the temporary resistor 120 should be selected to provide current limiting protection for the diode 130. Additionally, multiple resistors can be used to create an effective resistance.

The temporary resistor 120, the voltage source 160 and the switch 150 can be part of a driving circuitry of the memory device. The driving circuitry includes circuitry for reading and writing the memory cells of the memory cell array. The temporary resistor 120 is used to program (write), but not read, the memory cell 110. The driving circuitry also includes addressing logic used to individually address the individual memory cells of the memory cell array. Hence, one temporary resistor can be used to program the entire memory cell array. The switch 150 also allows the temporary resistor 120 to be disconnected. For example, the temporary resistor 120 can be disconnected from the memory cell 110 while the memory cell 110 is being read or reset by the other driving circuitry.

Figure 2:
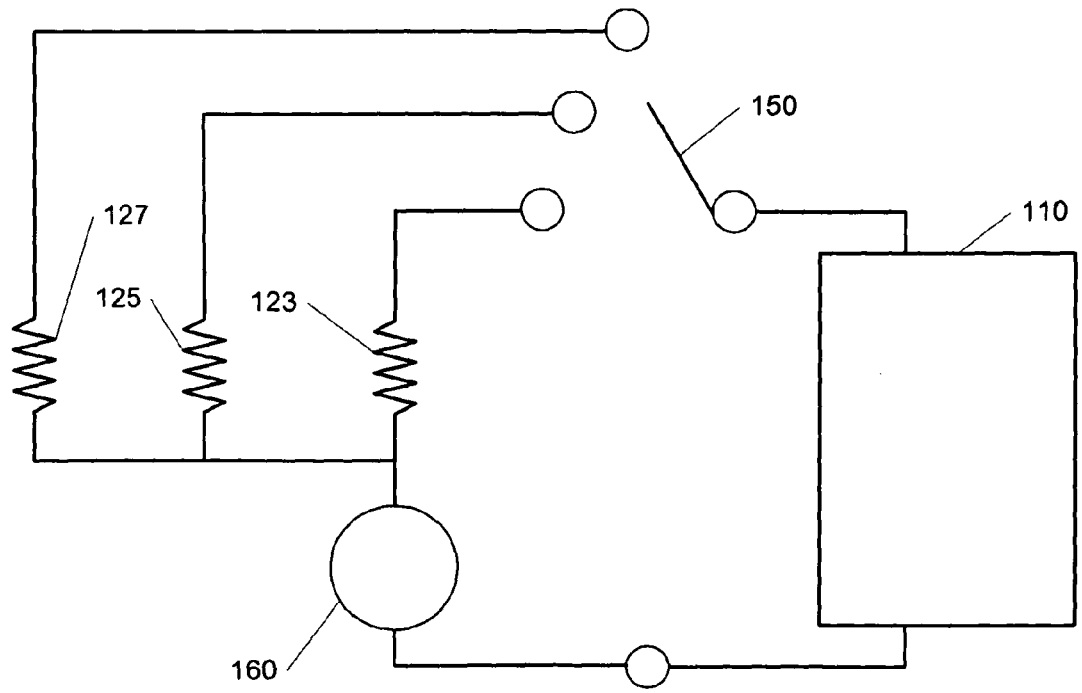
FIG. 2 is a schematic of a memory cell with multiple temporary resistors in accordance with a representative embodiment.

Referring to FIG. 2, a schematic of a memory cell 110 with multiple temporary resistors in accordance with a representative embodiment is shown. The memory cell 110 includes a diode and a resistivity switching material element. The memory cell 110 is part of a memory cell array in a memory device. During programming, a first temporary resistor 123, a second temporary resistor 125, or a third temporary resistor 127 and a voltage source 160 are electrically connected to the memory cell 110 by a switch 150. In one example, the first temporary resistor 123 is a 100 kΩ resistor, the second temporary resistor 125 is a 400 kΩ resistor, and the third temporary resistor 127 is a 800 kΩ resistor. The memory cell 110 and the voltage source 160 are grounded together.

Figure 3:
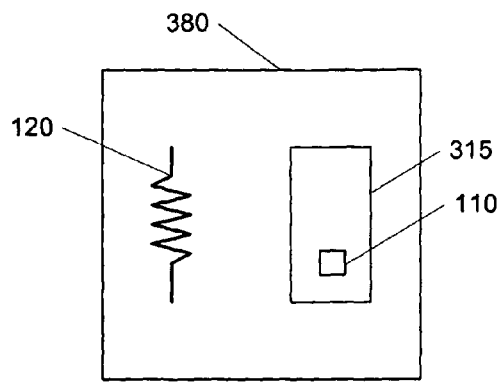
FIG. 3 is a top view of a memory cell located on the same chip as a temporary resistor in accordance with a representative embodiment.

Referring to FIG. 3, a top view of a memory cell 110 located on the same chip as a temporary resistor 120 in accordance with a representative embodiment is shown. The memory cell 110 is part of an array of memory cells 315. The temporary resistor 120 and the array of memory cells 315 can be integrated on a microchip 380. Where a temporary resistor and a memory cell are included in the same device, a switch or transistor is included to electrically isolate the resistor so that the memory cell can be read, reset, or programmed using other techniques. Alternatively, temporary resistor 120 and the array of memory cells 315 can be on separate chips but integrated into a single package.

Figure 4:
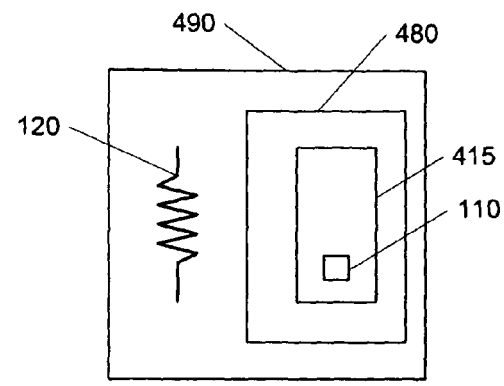
FIG. 4 is a top view of a memory cell located on the same circuit board as a temporary resistor in accordance with a representative embodiment.

Referring to FIG. 4, a top view of a memory cell 110 located on the same circuit board as a temporary resistor 120 in accordance with a representative embodiment is shown. The memory cell 110 is part of an array of memory cells 415 that are located on a memory device 480. The memory device 480 is an encapsulated semiconductor package. The temporary resistor 120 and the memory device 480 can be integrated on a printed circuit board 490. Where a temporary resistor and a memory cell are included in the same circuit board, a switch or transistor is included to electrically isolate the resistor so that the memory cell can be read, reset, or programmed using other techniques. The switch and other driving logic can be located in the memory device 480 or as a separate device located on the printed circuit board 490.

Figure 5:
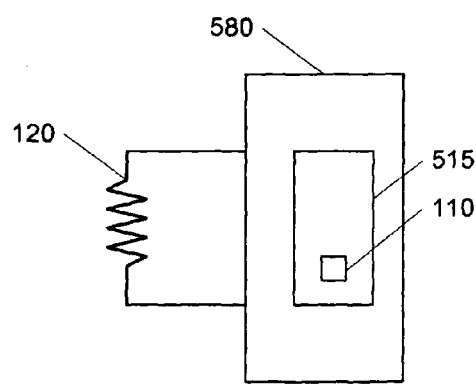
FIG. 5 is a top view of a memory cell separate from a temporary resistor in accordance with a representative embodiment.

Referring to FIG. 5, a top view of a memory cell 110 separate from a temporary resistor 120 in accordance with a representative embodiment is shown. The memory cell 110 is part of an array of memory cells 515 that are located on a memory device 580. The temporary resistor 120 can be removable. For example, at a processing plant the temporary resistor 120 can be temporarily attached to the memory device 580. After programming, the temporary resistor 120 is removed. The memory device 580 can then be assembled into other products or shipped to another plant for further assembly. Likewise, the voltage source can be part of an integrated device including memory cells or the voltage source can be removable.

Figure 6:
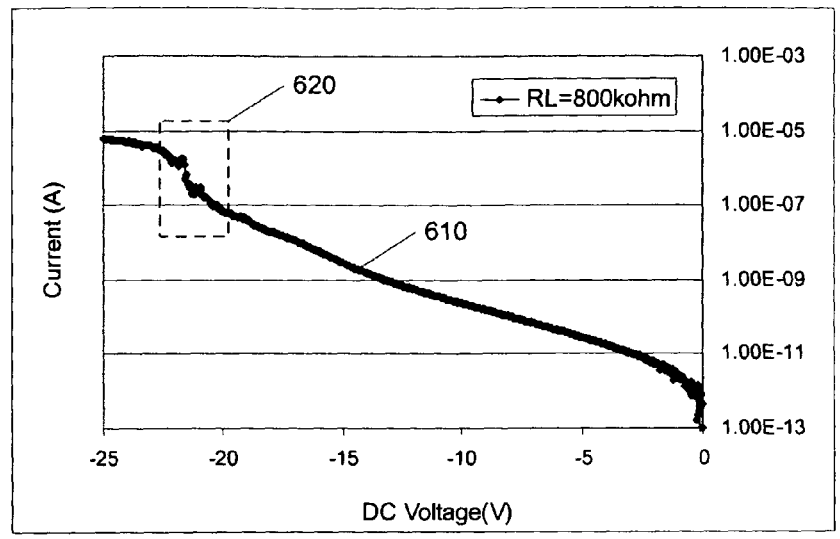
FIG. 6 is a graph of setting a memory cell with a 800 kΩ resistor in accordance with a representative embodiment.

Referring to FIG. 6, a graph of setting a memory cell with a 800 kΩ resistor in accordance with a representative embodiment is shown. During programming, a reverse bias can be applied to a memory cell by a voltage source using a temporary resistor in series with the memory cell. In this example, the temporary resistor is a 800 kΩ resistor. The memory cell includes a diode and a resistivity switching material element. In this example, the diode is a p-i-n diode fabricated using a 0.5 µm process, and a resistivity switching material element made of $HfO_2$.

A high reverse voltage (Vdiode+Vset) is applied on the memory cell as depicted by I-V (current-voltage) curve 610. When the reverse bias voltage reaches a switching point 620, the state of the resistivity switching material element changes from a first initial state to a second state different from the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor. A substantially initial state is any state within about the bounds of the definition of the initial state as defined by a reading circuit.

Figure 7:
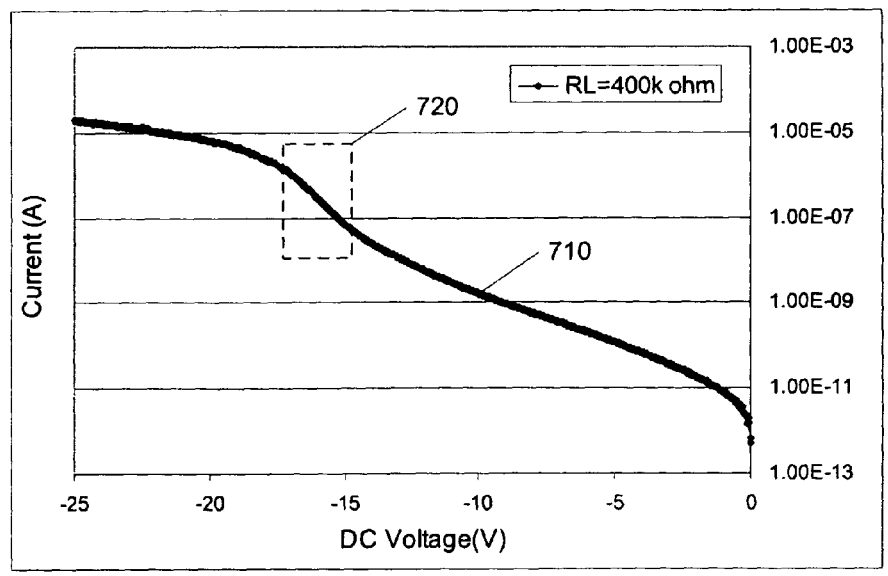
FIG. 7 is a graph of setting a memory cell with a 400 kΩ resistor in accordance with a representative embodiment.

After the memory cell has been changed to the second state, a reverse bias can be applied to the memory cell by the voltage source using a second temporary resistor in series with the memory cell. Referring to FIG. 7, a graph of setting a memory cell with a 400 kΩ resistor in accordance with a representative embodiment is shown. In this example, the temporary resistor is a 400 kΩ resistor. In this example, the memory cell has already been programmed with a 800 kΩ as in FIG. 6.

A high reverse voltage (Vdiode+Vset) is applied on the memory cell as depicted by I-V (current-voltage) curve 710. When the reverse bias voltage reaches a switching point 720, the state of the resistivity switching material element changes from the second state to a third state different from the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 8:
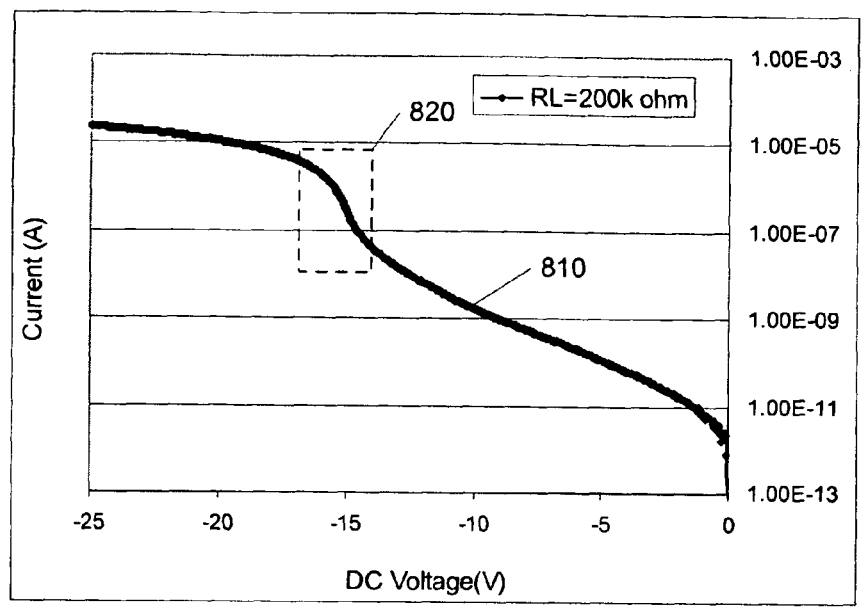
FIG. 8 is a graph of setting a memory cell with a 200 kΩ resistor in accordance with a representative embodiment.

After the memory cell has been changed to the third state, a reverse bias can be applied to the memory cell by the voltage source using a third temporary resistor in series with the memory cell. Referring to FIG. 8, a graph of setting a memory cell with a 200 kΩ resistor in accordance with a representative embodiment is shown. In this example, the temporary resistor is a 200 kΩ resistor. In this example, the memory cell has already been programmed with a 400 kΩ as in FIG. 7.

A high reverse voltage (Vdiode+Vset) is applied on the memory cell as depicted by I-V (current-voltage) curve 810. When the reverse bias voltage reaches a switching point 820, the state of the resistivity switching material element changes from the third state to a fourth state different from the third state, the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 9:
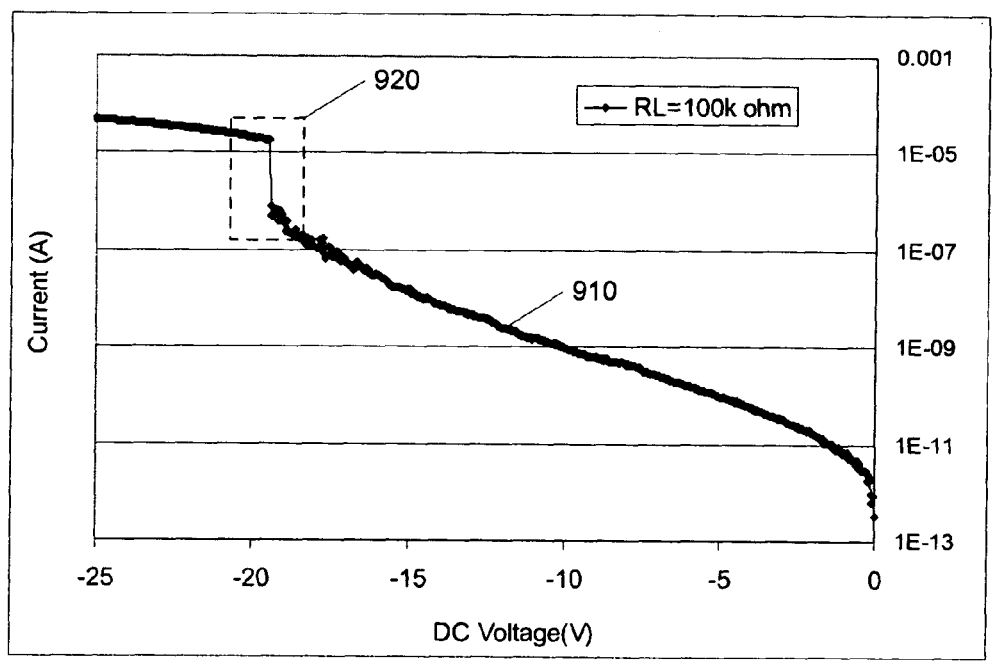
FIG. 9 is a graph of setting a memory cell with a 100 kΩ resistor in accordance with a representative embodiment.

After the memory cell has been changed to the fourth state, a reverse bias can be applied to the memory cell by the voltage source using a fourth temporary resistor in series with the memory cell. Referring to FIG. 9, a graph of setting a memory cell with a 100 kΩ resistor in accordance with a representative embodiment is shown. In this example, the temporary resistor is a 100 kΩ resistor. In this example, the memory cell has already been programmed with a 200 kΩ as in FIG. 8.

A high reverse voltage (Vdiode+Vset) is applied on the memory cell as depicted by I-V (current-voltage) curve 910. When the reverse bias voltage reaches a switching point 920, the state of the resistivity switching material element changes from the fourth state to a fifth state different from the fourth state, the third state, the second state or the first state. The switching point is, for example, about −15 volts to −25 volts across the temporary resistor, the diode, and the resistivity switching material element. The switching point approximately occurs at a reverse bias threshold voltage that depends on diode reverse leakage characteristics of the diode and a threshold voltage required to set the resistivity switching material element, which vary based on the type of diode, and the type of resistivity switching material element. The change is substantial; however, the change can be gradual.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring. The diode remains operational, but the resistivity switching material element has changed state. From any state, the memory cell can be returned, substantially, to its initial (original) state by applying a forward bias to the memory cell without the temporary resistor.

Figure 10:
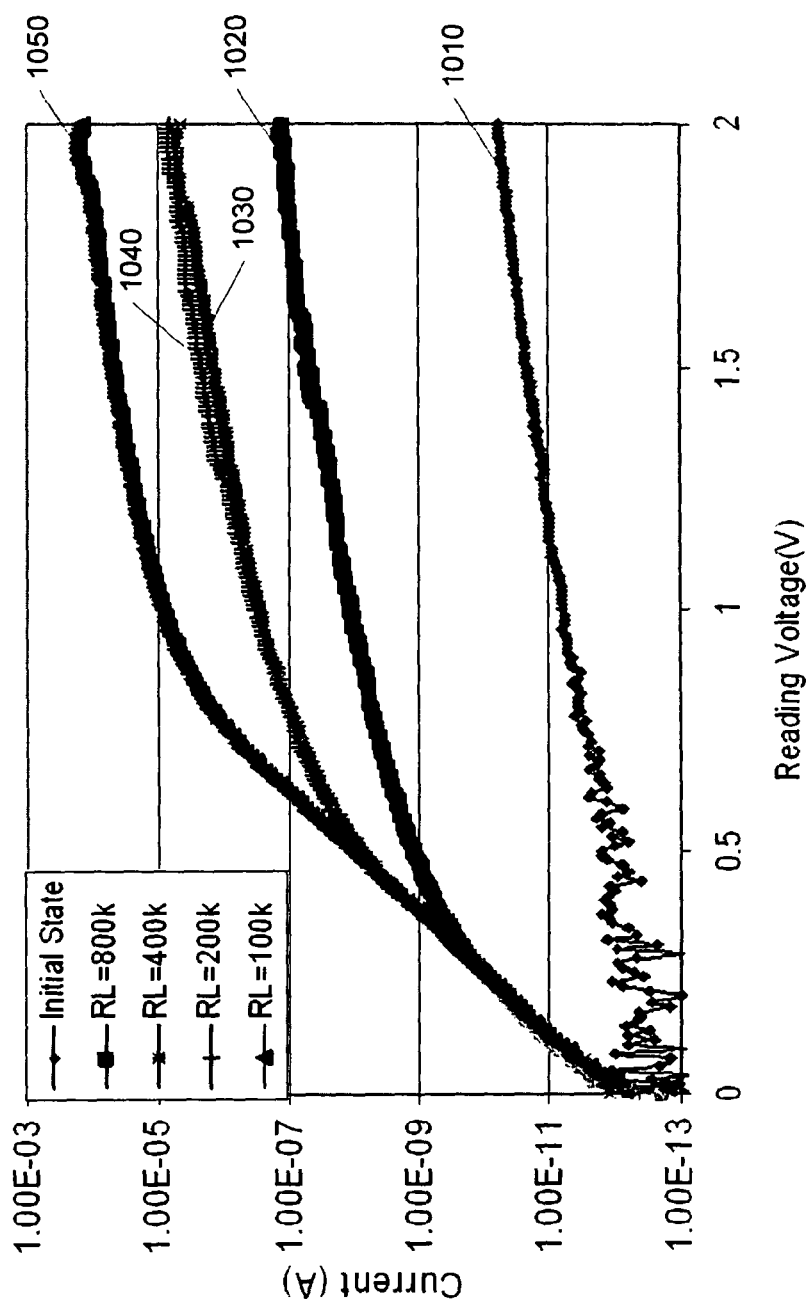
FIG. 10 is a graph comparing reading a memory cell by applying a forward bias in multiple states in accordance with a representative embodiment.

The memory cell can be read by applying a forward bias to the diode. Referring to FIG. 10, a graph comparing reading a memory cell by applying a forward bias in multiple states in accordance with a representative embodiment is shown. During reading, a forward bias can be applied to a memory cell by a voltage source without using a temporary resistor in series with the memory cell. As above, the diode is a p-i-n diode fabricated using a 0.5 μm process, and a resistivity switching material element made of HfO2.

Because different temporary resistors limit the reverse current to different levels, the memory cell is set to different states. Additionally, the memory cell has distinct states before and after programming. Each state has a different I-V (current-voltage) profile.

FIG. 10 shows I-V profiles of a memory cell read after being programmed with various temporary resistors. The first I-V profile 1010 shows the current readings when an unprogrammed memory cell is forward biased from 0V to 2V. For example, the current reading at a forward bias of 2V is about 2.00E-10 A. The second I-V profile 1020 shows the current readings when a memory cell programmed with a 800 kΩ resistor is forward biased from 0V to 2V. For example, the current reading at a forward bias of 2V is about 1.00E-7 A. The third I-V profile 1030 shows the current readings when a memory cell programmed with a 400 kΩ resistor is forward biased from 0V to 2V. For example, the current reading at a forward bias of 2V is about 2.00E-5 A. The fourth I-V profile 1040 shows the current readings when a memory cell programmed with a 200 kΩ resistor is forward biased from 0V to 2V. For example, the current reading at a forward bias of 2V is about 1.50E-5 A. The fifth I-V profile 1050 shows the current readings when a memory cell programmed with a 100 kΩ resistor is forward biased from 0V to 2V. For example, the current reading at a forward bias of 2V is about 1.00E-4 A. Hence, for at least in the 0.75V to 2V range, the memory cells programmed with distinct resistors produce distinct current readings.

Advantageously, the different states of a resistivity switching material element can represent different data values in a rewritable or one-time programmable memory. For example, an initial state can represent data value '00'; a state created with a 800 kΩ resistor can represent data value '01'; a state created with a 400 kΩ resistor can represent data value '10'; and a state created with a 100 kΩ resistor can represent data value '11'. Hence, any number of states and, therefore, data values can be stored in the resistivity switching material elements based upon the number of resistors available and the sensitivity of the reading circuit. Resistors can be combined in series and parallel to increase the number of resistance values available while reducing the number of resistors needed.

Figure 11:
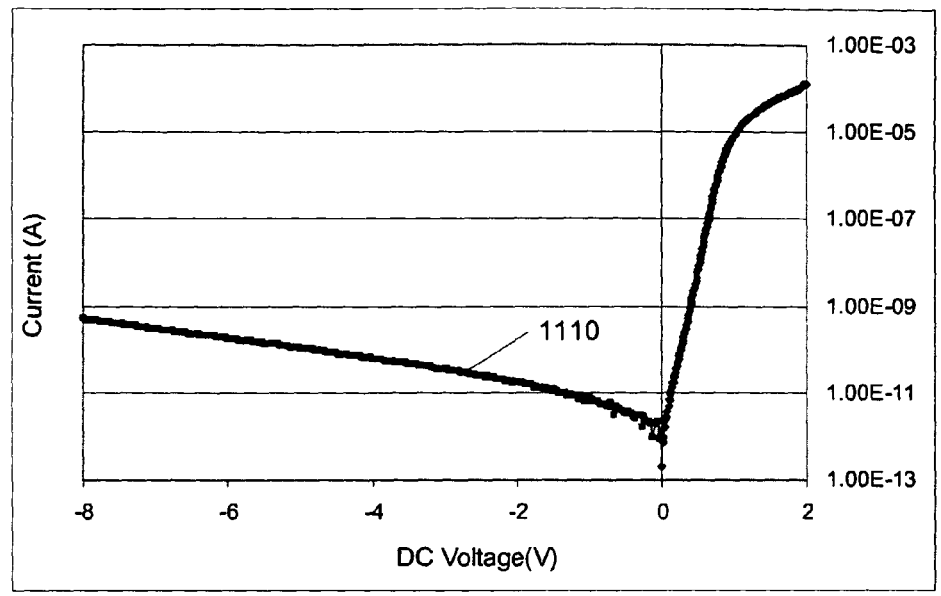
FIG. 11 is a graph depicting an I-V profile of a diode in a memory cell after being programmed with a 100 kΩ resistor in accordance with a representative embodiment.

After programming, the diode in the memory cell remains operational. Referring to FIG. 11, a graph depicting an I-V profile 1110 of a diode in a memory cell after being programmed with a 100 kΩ resistor in accordance with a representative embodiment is shown. As above, the diode is a p-i-n diode fabricated using a 0.5 μm process, and a resistivity switching material element made of HfO2. In this example, the memory cell was programmed using a 100 kΩ resistor. The I-V profile 1110 was created by forward biasing the diode from the memory cell from −8V to 2V without the 100 kΩ resistor. I-V profile 1110 shows the I-V curve of a working diode; specifically, the curve show the traditional switching effect at IV. Advantageously, programming the memory cell using a reverse bias with temporary resistor technique does not damage the diode.

Figure 12:
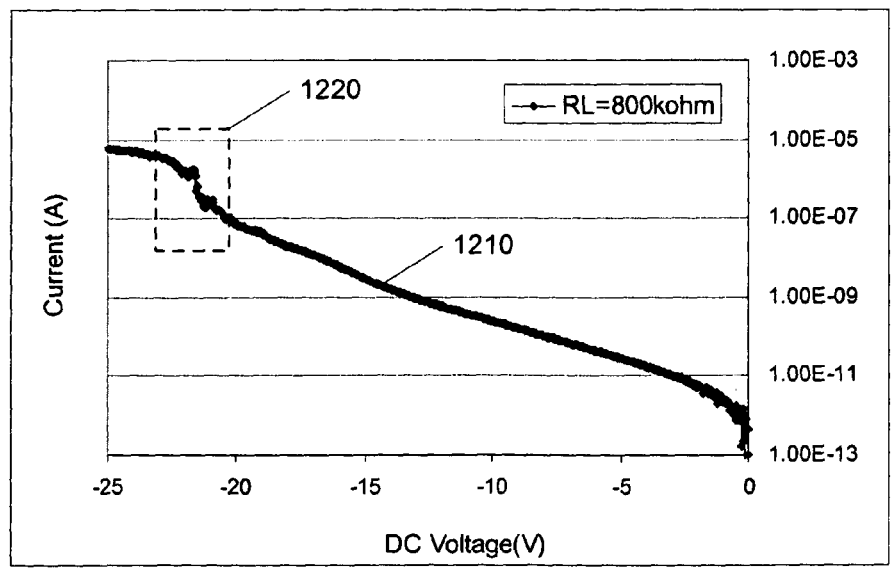
FIG. 12 is a graph depicting an I-V profile of setting a fresh memory cell with a 800 kΩ resistor in accordance with a representative embodiment.

Advantageously, fresh memory cells produce repeatable results. Referring to FIG. 12, a graph depicting an I-V profile of setting a fresh memory cell with a 800 kΩ resistor in accordance with a representative embodiment is shown. In this example, a reverse bias is applied to a fresh (un-programmed) memory cell by a voltage source using a 800 kΩ temporary resistor in series with the memory cell. The memory cell includes a p-i-n diode fabricated using a 0.5 μm process, and a resistivity switching material element made of HfO$_2$.

A high reverse voltage (Vdiode+Vset) is applied on the memory cell as depicted by I-V (current-voltage) curve 1210. When the reverse bias voltage reaches a switching point 1220, the state of the resistivity switching material element changes from a first initial state to a second state different from the first state. The switching point is about −15 volts to −25 volts across the temporary resistor, the diode, and the resistivity switching material element.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring.

Figure 13:
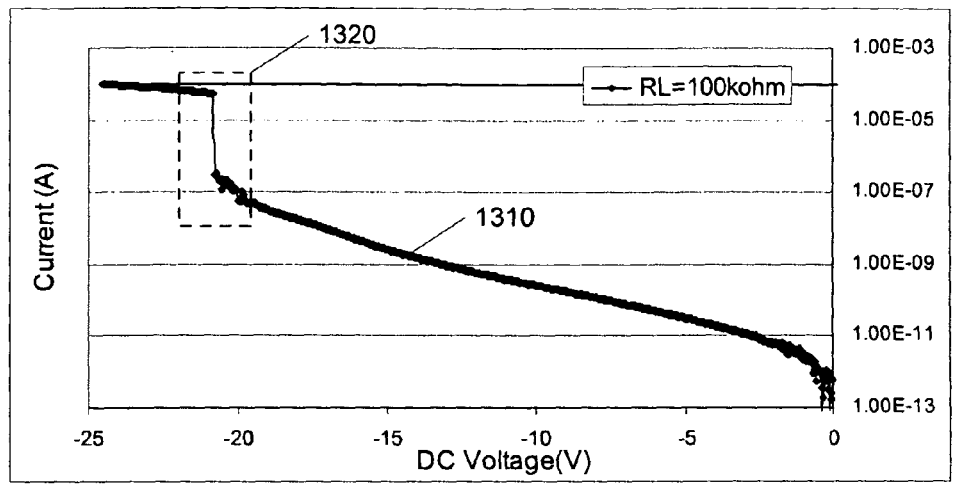
FIG. 13 is a graph depicting an I-V profile of setting a second fresh memory cell with a 100 kΩ resistor in accordance with a representative embodiment.

Referring to FIG. 13, a graph depicting an I-V profile of setting a second fresh memory cell with a 100 kΩ resistor in accordance with a representative embodiment is shown. In this example, a reverse bias is applied to a fresh (un-programmed) memory cell by a voltage source using a 100 kΩ temporary resistor in series with the memory cell. The memory cell includes a p-i-n diode fabricated using a 0.5 μm process, and a resistivity switching material element made of HfO$_2$.

A high reverse voltage (Vdiode+Vset) is applied on the memory cell as depicted by I-V (current-voltage) curve 1310. When the reverse bias voltage reaches a switching point 1320, the state of the resistivity switching material element changes from a first initial state to a second state different from the first state. The switching point is about −15 volts to −25 volts across the temporary resistor, the diode, and the resistivity switching material element.

Once the Vset is high enough to set the memory cell, the voltage on memory cell drops quickly and the diode changes into its breakdown transition region. After the resistivity switching material element changes state, the temporary resistor protects the diode in the memory cell by limiting the amount of current that can pass through the diode. Hence, the temporary resistor prevents diode breakdown from occurring.

Figure 14:
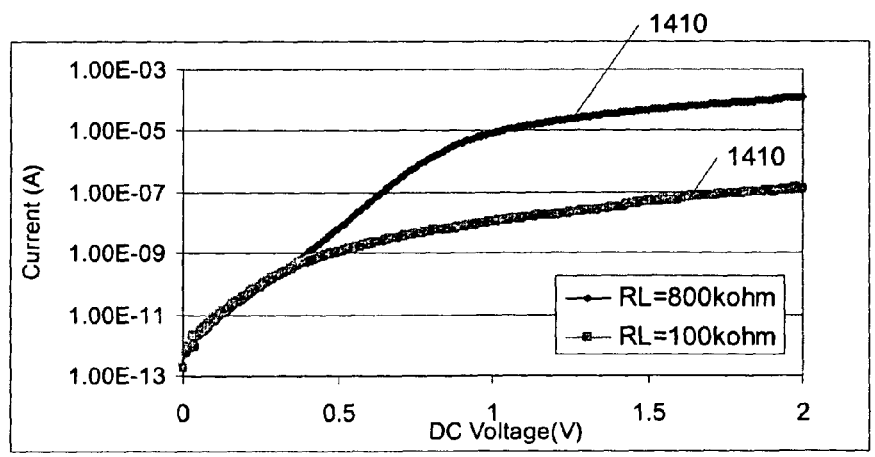
FIG. 14 is a graph comparing readings from a first fresh memory cell programmed with a 800 kΩ resistor and a second fresh memory cell programmed with a 100 kΩ resistor in accordance with a representative embodiment.

Referring to FIG. 14, a graph comparing readings from a first fresh memory cell programmed with a 800 kΩ resistor and a second fresh memory cell programmed with a 100 kΩ resistor in accordance with a representative embodiment is shown. The first I-V profile 1410 shows the current readings when the first fresh memory cell, programmed with the 100 kΩ resistor, is forward biased from 0V to 2V. For example, the current reading at a forward bias of 2V is about 1.00E-4 A. The second I-V profile 1420 shows the current readings when the second fresh memory cell, programmed with the 800 kΩ resistor, is forward biased from 0V to 2V. For example, the current reading at a forward bias of 2V is about 1.00E-7 A. Hence, for at least in the 0.75V to 2V range, the memory cells programmed with distinct resistors produce distinct current readings. Additionally, the first I-V profile 1410 of the first fresh memory cell, programmed with the 100 kΩ resistor, matches the I-V profile of the memory cell programmed with a 100 kΩ resistor of FIG. 10 (the memory cell of FIG. 10 was programmed multiple times). Likewise, the second I-V profile 1420 of the second fresh memory cell, programmed with the 800 kΩ resistor, matches the I-V profile of the memory cell programmed with a 800 kΩ resistor of FIG. 10 (the memory cell of FIG. 10 was programmed multiple times).

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, types of diodes and resistivity switching materials may be changed without deviating from the spirit of the invention. Similarly, various types and numbers of diodes may be employed such as distributed diodes. Likewise, the device and methods of the present invention may be practiced using other passive element memory systems. Consequently, a wide variety of current-voltage profiles are possible. Hence, a switching point voltage range of −15V to −25 is not limiting. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n− region by an antifuse element. When the antifuse element is programmed, the p+ region is electrically connected to the n− region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, carbon nanotube layers, which may be formed as described in US Patent Pub 20050269553 Sen, Rahul; et al. which is hereby incorporated by reference, and amorphous, polycrystalline or microcrystalline carbon layers can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A method of programming a memory cell comprising:
applying a reverse bias to the memory cell using a temporary resistor in series with the memory cell, wherein the memory cell comprises a diode and a resistivity switching material element in series;
removing the temporary resistor; and
reading the state of the resistivity switching material element in the memory cell, wherein the state of the resistivity switching material element changes from a first initial state to a second state different from the first state.

2. The method of claim 1, further comprising:
applying a forward bias to the memory cell, without using the temporary resistor, to change the state of the resistivity switching material element from the second state substantially to the first state.

3. The method of claim 1, wherein the memory cell is part of a memory array.

4. The method of claim 3, wherein
the diode comprises a p-n semiconductor diode, a p-i-n semiconductor diode, a metal insulator metal (MIM) diode, or a metal insulator-insulator metal (MIIM) diode; and
the resistivity switching storage element comprises a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

5. The method of claim 4, wherein the state of the resistivity switching material element changes substantially at a reverse bias threshold voltage.

6. The method of claim 5, wherein the reverse bias threshold voltage depends on diode reverse leakage characteristics of the diode and a threshold voltage required to set the resistivity switching material element.

7. The method of claim 6, wherein the reverse bias threshold voltage is approximately −15 volts to −25 volts across the temporary resistor, the diode, and the resistivity switching material element.

8. The method of claim 1, wherein the memory cell further comprises a second diode.

9. The method of claim 1, wherein the temporary resistor and the memory cell are located on the same die.

10. The method of claim 1, wherein the temporary resistor is not located on the same die as the memory cell.

11. The method of claim 10, wherein the temporary resistor is removed after programming the memory cell.

12. A method of programming a memory cell comprising:
applying a first reverse bias to the memory cell using a first temporary resistor in series with the memory cell, wherein the memory cell comprises a diode and a resistivity switching material element in series, and wherein the state of the resistivity switching material element changes from a first initial state to a second state different from the first state;
applying a second reverse bias to the memory cell using a second temporary resistor in series with the memory cell, wherein the state of the resistivity switching material element changes from the second state to a third state different from the second state, and wherein the first temporary resistor and the second temporary resistor have different resistances;
applying a third reverse bias to the memory cell using a third temporary resistor in series with the memory cell, wherein the state of the resistivity switching material element changes from the third state to a fourth state different from the third state;

removing the temporary resistors; and reading the state of the resistivity switching material element in the memory cell;

wherein the first temporary resistor, the second temporary resistor, and the third temporary resistor have different resistances;

wherein the first state, the second state, the third state, and the fourth state are different from each other;

wherein the first state corresponds to a first data value, the second state corresponds to a second data value, the third state corresponds to a third data value, and the fourth state corresponds to a fourth data value; and wherein the memory cell is part of a memory cell array.

13. The method of claim 12, wherein the temporary resistors are not located on the same die as the memory cell.

14. The method of claim 12, further comprising:

applying a forward bias to the memory cell, without using one of the temporary resistors, to change the state of the resistivity switching material element to substantially the first state.

* * * * *